United States Patent [19]
Roy et al.

[11] Patent Number: 5,557,124
[45] Date of Patent: Sep. 17, 1996

[54] FLASH EEPROM AND EPROM ARRAYS WITH SELECT TRANSISTORS WITHIN THE BIT LINE PITCH

[75] Inventors: Anirban Roy, Fremont; Reza Kazerounian, Alameda, both of Calif.

[73] Assignee: Waferscale Integration, Inc., Fremont, Calif.

[21] Appl. No.: 212,176

[22] Filed: Mar. 11, 1994

[51] Int. Cl.$^6$ .................................................. H01L 29/788
[52] U.S. Cl. ........................ 257/316; 257/322; 365/185.06
[58] Field of Search ............................... 365/63, 189.01, 365/185, 185.06; 257/316, 322; 437/43

[56] References Cited

U.S. PATENT DOCUMENTS

| | | | |
|---|---|---|---|
| 4,267,632 | 5/1981 | Shappir | 29/571 |
| 5,126,808 | 6/1992 | Montalvo et al. | 365/185 |
| 5,151,375 | 9/1993 | Kazerounian et al. | 437/43 |
| 5,204,835 | 4/1993 | Eitan | 365/185 |
| 5,379,254 | 1/1995 | Chang | 365/189.01 |
| 5,402,372 | 3/1995 | Bergemont | 365/185 |

OTHER PUBLICATIONS

W. Kammerer et al., "A New Virtual Ground Array Architecture For Very High Speed, High Density EPROMS", VLSI Circuits Symposium, Japan, 1991.
S. Cagnina et al., "A 0.85 μm Double Metal CMOS Technology for 5V Flash EEPROM Memories with Sector Erase", 12th NVSM Workshop, Monterey, CA, 1992.

*Primary Examiner*—Robert P. Limanek
*Attorney, Agent, or Firm*—Skjerven, Morrill, MacPherson, Franklin & Friel; Forrest E. Gunnison

[57] ABSTRACT

Flash EEPROM array and EPROM arrays are described. The EEPROM array has EEPROM areas with arrays of EEPROM transistors, at least one control area per EEPROM area and columns of a first polysilicon layer traversing the EEPROM and control areas. The columns are divided into even and odd columns. Each control area is divided into upper, middle and lower areas and each control area includes the following: a) within the middle area, cross-lines of the first polysilicon extending from each even to the next odd column; b) four rows of a second polysilicon layer, laid down after the columns and cross-lines of the first polysilicon layer within the control areas are removed; and c) isolating oxide elements laid down prior to the first polysilicon layer and self-aligned to it before it is removed. The isolating oxide elements are located under every odd column in the upper area, under each column in the middle area, under each odd column in one row of the lower area and under each even column in the other row of the lower area. Bit line select and erase select rows are in the upper and middle areas, respectively, and two column select rows are in the lower area. Erase select transistors are formed at the intersections of the removed cross-lines with the erase select row of second polysilicon, bit line select transistors are formed at the intersections of removed even columns with the bit line select row of second polysilicon, and column select transistors are formed at intersections of the column select rows of second polysilicon with the removed columns wherever no isolating oxide elements exist. The EPROM array has a similar structure but does not include the erase select transistors. The select transistors are n-channel transistors each formed of a) a channel, b) two diffusion bit lines bordering the channel and aligned to a first, subsequently removed, polysilicon layer and c) a second polysilicon layer extending between and over the two diffusion bit lines.

11 Claims, 8 Drawing Sheets

FLASH EEPROM AND EPROM ARRAYS WITH SELECT TRANSISTORS WITHIN THE BIT LINE PITCH

FIELD OF THE INVENTION

The present invention relates to electrically programmable read only memory (EPROM) arrays and to flash electrically erasable programmable read only memory (EEPROM) arrays generally and to alternating metal virtual ground EPROM and EEPROM arrays in particular.

BACKGROUND OF THE INVENTION

EPROMs and electrically erasable programmable read only memory (EEPROM) arrays arc basic building blocks of microprocessor systems. The EPROM and EEPROM arrays arc comprised of a plurality of EPROM or EEPROM cells, each of which must be individually activatable.

Over the years, EPROM and EEPROM arrays have been continually improved, both in speed and in density, thereby to enable the microprocessor systems to run complicated programs at faster speeds. Different architectures provide different densities and different operating speeds, where typically an improvement in speed comes at a cost of reduced density, and vice versa.

Some types of EPROM arrays arc common source arrays, virtual ground arrays, partitioned virtual ground arrays and alternate metal virtual ground arrays. Some types of EEPROM arrays are common source arrays and virtual ground arrays.

A virtual ground architecture is described in U.S. Pat. No. 4,267,632. In the '632 patent, a first plurality of parallel spaced-apart, polycrystalline silicon ("polysilicon") lines is defined on one surface of but insulated from, the silicon semiconductor substrate. Parallel, spaced apart doped regions ("diffusion bit lines") are formed in the silicon substrate between these first polysilicon ("poly 1") lines and in alignment with these lines. A second plurality of parallel, spaced-apart, polysilicon lines ("poly 2"), insulated from the poly 1 lines and the diffusion bit lines in the substrate, is formed perpendicular to the poly 1 lines and the diffusion bit lines. The poly 2 lines are then used as an etch mask to remove those portions of the poly 1 lines not covered by the poly 2 lines. The portions of the poly 1 lines remaining beneath the poly 2 lines are located between the diffusion bit lines and are the floating gates of the EPROM transistors, or cells.

While the '632 patent yields a plurality of floating gate devices in a relatively high density array, the cell size is still larger than desired. One reason for this is that one metal line is formed above each elongated diffusion bit line. Consequently, the size of the array is increased both by the widths of these metal lines and by the need to have numerous contacts (which of necessity are wider than the widths of the metal lines) between such metal lines and the underlying elongated diffusion bit lines. In addition, having a symmetrical transistor (source and drain are interchangeable) complicates the programming function in virtual ground arrays.

Furthermore, when reading a selected EPROM cell, the drain diffusion bit line is pre-charged to a predetermined level and the EPROM cell is read by removing charge from the drain line. It will be appreciated by those skilled in the art that the reading time is inversely dependent on the capacitance of the drain line and that the capacitance of each drain line is a function of the accumulation of the capacitance of the many EPROM cells attached to it.

Reference is now made to FIGS. 1A and 1B which illustrate a partitioned virtual ground architecture described in the article "A New Virtual Ground Array Architecture for Very High Speed, High Density EPROMs", presented at the 1991 VLSI Circuits Symposium, Japan by W. Kammerer, et al., employees of the common assignees of the present invention.

In this architecture, there are two types of alternating diffusion bit lines, segmented ones 22 and continuous ones 24. The segmentation is provided in order to reduce bit line capacitance and achieve thereby a high operating speed.

Each diffusion bit line 22 or 24 is associated with a metal line 20 or 21, respectively, and a contact 28 or 30, respectively. The segmented diffusions 22 are connected to the metal lines 20 and contacts 28 via n-channel select transistors 26.

The n-channel transistors 26 and contacts 28 are located in one area of the array and the contacts 30 are placed in a second area of the array, thereby to minimize the amount of space they utilize. The pitch of the partitioned virtual ground architecture is limited by the width of the transistor 26 and, due to the staggering of the contacts 28 and 30, by one-half contact 28 or 30.

Typically, developments in EPROM manufacturing processes have not decreased the metal pitch as much as the pitch of the poly 1 and poly 2 layers. Since the metal pitch is considerably larger than the minimum dimension of an EPROM cell and since the partitioned virtual ground architecture has one metal line per cell, the metal pitch is the limiting factor in the size of each cell.

To achieve a maximal operating speed during a read operation, the sensed bit line must have the least capacitance and therefore, must be one of the segmented diffusions 22. As a result, for reading, the segmented diffusions 22 are dedicated read lines and the continuous diffusions 24 are dedicated source lines. However, for programming, the arrangement described hereinabove docs not work since the n-channel transistors 26 cannot transfer the high voltage and high current required to program a cell. Therefore, during programming, the continuous diffusions 24 are dedicated to serve as high voltage terminals and the segmented diffusions 22 are dedicated to serve as source terminals.

Segmentation is also utilized for separating a flash EEPROM array into a plurality of isolated EEPROM areas. This architecture is described in U.S. Pat. No. 5,126,808, a copy of whose FIG. 5 is presented herein as FIG. 2 to whom reference is now made.

The segmented flash EEPROM architecture includes a plurality of EEPROM pages 100-k, each comprised of a multiplicity of flash EEPROM cells (ki,j), where k indicates the page number, i the row number and j the column number. The EEPROM cells (ki,j) are common ground array flash EEPROM transistors, wherein the sources S are connected to each other and to a ground signal.

The drain bit lines D are strapped by segmented metal lines BLk-j of a first metal layer. The rectal line segments BLk-j are the local bit lines. The segmented metal lines of a page k are connected to continuous second metal lines BLk, which are global bit lines, through n-channel select transistors (i,j). Due to the use of the local bit lines, only one local block k is connected to the global bit line at any one time. If there are eight local blocks and bit lines, this segmentation reduces the bit line capacitance by a factor of 8.

However, before an EPROM or EEPROM cell can be read, its drain must be pro-charged to a certain level. If no voltage is applied to a page of an EPROM or EEPROM array, the level of charge will slowly decay. Therefore, in the flash EEPROM architecture of U.S. Pat. No. 5,126,808, each page must first be pre-charged before the data stored therein can be sensed. This reduces the operating speed.

The flash EEPROM architecture described in U.S. Pat. No. 5,126,808 has one metal line and one contact for every diffusion bit line. Thus, the area of the flash EEPROM array of U.S. Pat. No. 5,126,808 is large and is limited by the metal pitch.

If there were only one metal line for every two diffusion bit lines and a contact, the limiting factor would not be the metal pitch, but rather the pitch of the polysilicon layers. This is known as a "poly pitch limited" architecture. One architecture which has only one such metal line is that of the alternating metal virtual ground EPROM array, described in U.S. Pat. Nos. 5,204,835 and 5,151,375, assigned to the common assignee of the present invention, and illustrated in FIG. 3 to which reference is now made. U.S. Pat. Nos. 5,204,835 and 5,151,375 are incorporated herein by reference.

The EPROM array of U.S. Pat. Nos. 5,151,375 and 5,204,835 comprises an EPROM area 50 comprising a plurality of EPROM transistors 52, or cells, surrounded by two "control areas" 54 comprising control elements, detailed hereinbelow.

In the EPROM area 50, each cell 52 comprises a gate 56, a source 58 and a drain 60. The sources 58 of a column of EPROM cells 52 together form non-metal-strapped, segmented diffusion bit lines, labeled S−1, S and S+1. The drains 60 of a column of EPROM cells 52 together form metal-strapped, continuous diffusion bit lines labeled M−1, M and M+1. Segmented bit lines S−1, S and S+1 typically connect together N EPROM cells 52, where N is typically 64. The gates 56 of a row of cells are connected to one word line WLi.

Each control area 54 comprises select transistors 62, contacts 66 and select lines SELn and SEL(n+1). Select transistors 62 are typically stacked gate transistors but can also be n-channel devices. One contact 66 is connected to each bit line M−1, M or M+1 in each control area 54.

A pair of select transistors 62 from the two control areas 54 controlling an EPROM area 50 are operative, when activated by the appropriate select lines SELn or SEL(n+1), to connect one segmented diffusion bit line S−1, S or S+1 to a neighboring continuous diffusion bit line M−1, M or M+1.

In order to access the EPROM cell labeled 52a, the following lines are activated: word line WL1, select lines SEL(n+1) and bit lines M and M−1. Bit line M receives the drain voltage and bit line M−1 receives the source voltage, which is typically a ground voltage. The select transistors 62 which are activated by select lines SEL(n+1) transfer the source voltage from bit line M−1 to the segment S−1. Word line WL1 activates a row of EPROM cells and bit lines M and M−1 activate a column of cells, thereby activating only EPROM cell 52a, which sits at the intersection of the activated row and column. The output of the EPROM cell 52a is provided through the contact 66 which is connected to the appropriate bit line.

In order to access the EPROM cell labeled 52b, voltage is placed on word line WL1, select lines SELn and metal strapped bit lines M−1 and M. Metal strapped bit lines M−1 and M become the drain and source, respectively, wherein the source is transferred to segment S−1 through the select transistors 62a.

It is noted that tim source is always transferred to the segment lines Sj. It can be seen that the metal strapped bit lines Mj act as sources whenever they are connected to a segment line and as drains otherwise.

It will further be appreciated that, when the select lines SEL(n+1) activate a row of select transistors 62, they connect each bit line Mj with a segmented bit line Sj. Thus, when reading EPROM cell 52a, metal strapped bit line M−1 is connected, through the select transistor labeled 62a, to the segmented bit line S−1. This transfers the source to bit line S−1. At the same time, metal strapped bit line M (the drain) is connected, through the select transistor labeled 62b, to the segmented bit line S. Thus, the capacitance of the drain line is the sum of capacitance of the metal strapped bit line M plus the capacitance of the segmented bit line S connected to it. The overall bit line capacitance in this architecture has no advantages or disadvantages relative to other prior art architectures. It has a smaller area but adds capacitance due to the fact that the diffusions are continuous across the array.

Therefore, although the alternating metal virtual ground architecture described in U.S. Pat. Nos. 5,204,835 and 5,151,375 has a very high density, its operating speed is slower than desired, due to the extensive capacitance of the operative drain line.

SUMMARY OF THE PRESENT INVENTION

It is an object of the present invention to provide a generally poly pitch limited flash EEPROM array.

It is a further object of the present invention to provide segmentation while generally remaining within the poly pitch of an EPROM or EEPROM array.

There is therefore provided, in accordance with a preferred embodiment of the present invention, a flash EEPROM array which includes a) EEPROM areas having arrays of EEPROM transistors, b) at least one control area per EEPROM area and c) columns of a first polysilicon layer traversing the EEPROM and control areas. The columns are divided into even and odd columns wherein the column numbering increases from left to right. Each control area is divided into upper, middle and lower areas and includes a) cross-lines of the first polysilicon extending from each even to the next odd colunm within the middle area, b) four rows of a second polysilicon layer, laid down after the columns and cross-lines of the first polysilicon layer within the control areas is removed and c) isolating oxide elements laid down prior to the first polysilicon layer and self-aligned to it before it is removed. The isolating oxide elements are located under every odd column in the upper area, under each column in the middle area, under each odd column in one row of the lower area and under each even column in the other row of the lower area. The bit line select and erase select rows are in the upper and middle areas, respectively, and two column select rows are in said lower area. Erase select transistors are formed at the intersections of the removed cross-lines with the erase select row of second polysilicon, bit line select transistors are formed at the intersections of removed even columns with the bit line select row of second polysilicon, and column select transistors are formed at intersections of the column select rows of second polysilicon with the removed columns wherever no isolating oxide elements exist.

Additionally, in accordance with a preferred embodiment of the present invention, the flash EEPROM array includes diffusion bit lines aligned to the columns of said first polysilicon layer and formed into even and odd diffusion bit lines. The odd diffusion bit lines have the odd columns of first polysilicon to their left and the even bit lines have the even columns of first polysilicon to their left. The array also includes second cross-lines of the first polysilicon layer, also removed, crossing from the odd columns to the even columns, thereby to segment the odd diffusion bit lines.

Moreover, in accordance with a preferred embodiment of the present invention, the array also includes metal lines, each one lying over one of the even columns. The column select transistors connect between the even and odd diffusion bit lines, the bit line select transistors connect between the metal lines and the odd diffusion bit lines, and the erase select transistors connect between the metal lines and the even diffusion bit lines.

Further, in accordance with a preferred embodiment of the present invention, the columns of first polysilicon have a pitch which is defined by a desired pitch for the EEPROM transistors.

There is also provided, in accordance with a second preferred embodiment of the present invention, an EPROM array including EPROM areas comprising arrays of EPROM transistors, at least one control area per EPROM area and columns of a first polysilicon layer traversing the EPROM and control areas. The columns are divided into even and odd columns. Each of the control areas are similar to those of the EEPROM array except that there are only three rows, one for bit line select transistors and two for column select transistors. As in the EEPROM array, the control areas include cross-lines of the first polysilicon extending from each even to the next odd column within the middle area of the control areas. These cross-lines segment diffusion bit lines rather than forming the basis for erase select transistors as in the EEPROM array.

Moreover, in accordance with the second preferred embodiment of the present invention, the EPROM array also includes metal lines, each one lying over one of the even columns, wherein the column select transistors connect between the even and odd diffusion bit lines and the bit line select transistors connect between the metal lines and said odd diffusion bit lines.

There is also provided, in accordance with a third preferred embodiment of the present invention, an EEPROM array having a drain erase capability. The array includes EEPROM areas having arrays of EEPROM transistors, at least one control area per EEPROM area and columns of a first polysilicon layer traversing the EEPROM and control areas. The columns are divided into even and odd columns. The EEPROM array has a similar layout to that of the EPROM array described hereinabove. There also are diffusion bit lines aligned to the columns of the first polysilicon layer and formed into even and odd diffusion bit lines segmented by the cross-lines and metal lines, each one lying next to one of the even diffusion bit lines. Bit line select transistors are formed at the intersections of removed even columns with the bit line select row of second polysilicon and connect between the metal lines and the odd diffusion lines, and column select transistors are formed at intersections of the column select rows of second polysilicon with the removed columns wherever no isolating oxide elements exist and connect the even to the odd and the odd to the even diffusion bit lines. Drain erase is achieved by activating the bit line select transistors and by providing voltage on the metal lines.

There is further provided, in accordance with a fourth preferred embodiment of the present invention, an n-channel transistor including a channel, two diffusion bit lines bordering the channel and aligned to a first, subsequently removed, polysilicon layer and a second polysilicon layer extending between and over the two diffusion bit lines.

BRIEF DESCRIPTION OF THE DRAWINGS

The present invention will be understood and appreciated more fully from the following detailed description taken in conjunction with the drawings in which:

FIG. 6D is taken along lines VID—VID of FIG. 5;

DETAILED DESCRIPTION OF A PREFERRED EMBODIMENT

Reference is now made to FIGS. 4–6E which illustrate a portion of a flash EEPROM array having an alternating metal ground architecture, constructed and operative in accordance with a preferred embodiment of the present invention.

The flash EEPROM array typically comprises at least one EEPROM area 100 comprising a plurality of EEPROM cells 102 and two control areas 110 per EEPROM area 100. As in the prior art, rows of the EEPROM cells 102 are connected together through word lines WLj, where j typically varies from 1 to 64.

Figure 1A:
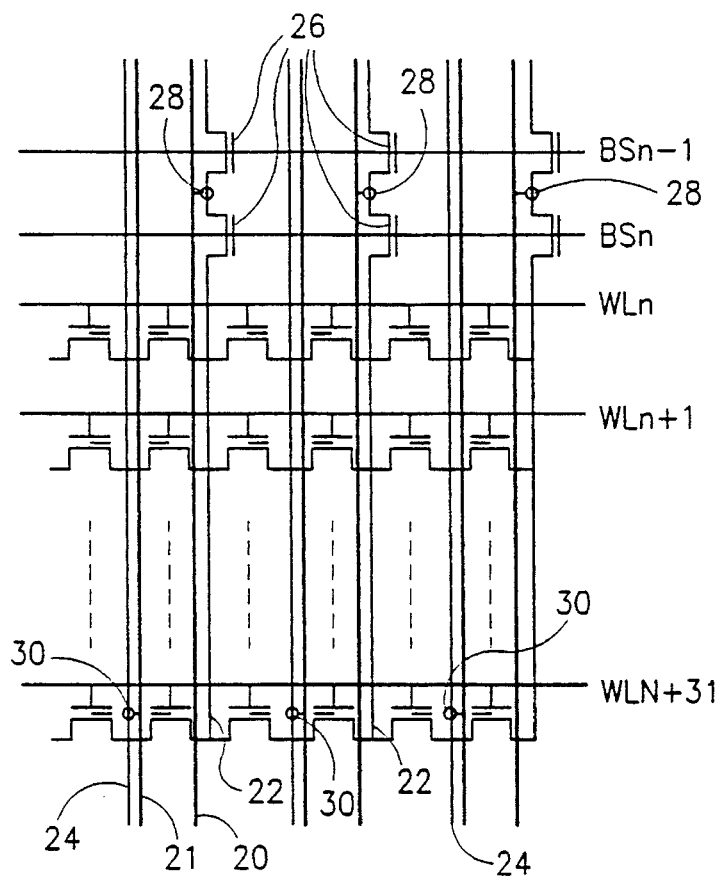
FIGS. 1A and 1B are circuit diagram and layout illustrations, respectively, of a prior art virtual ground EPROM architecture.
Figure 1B:
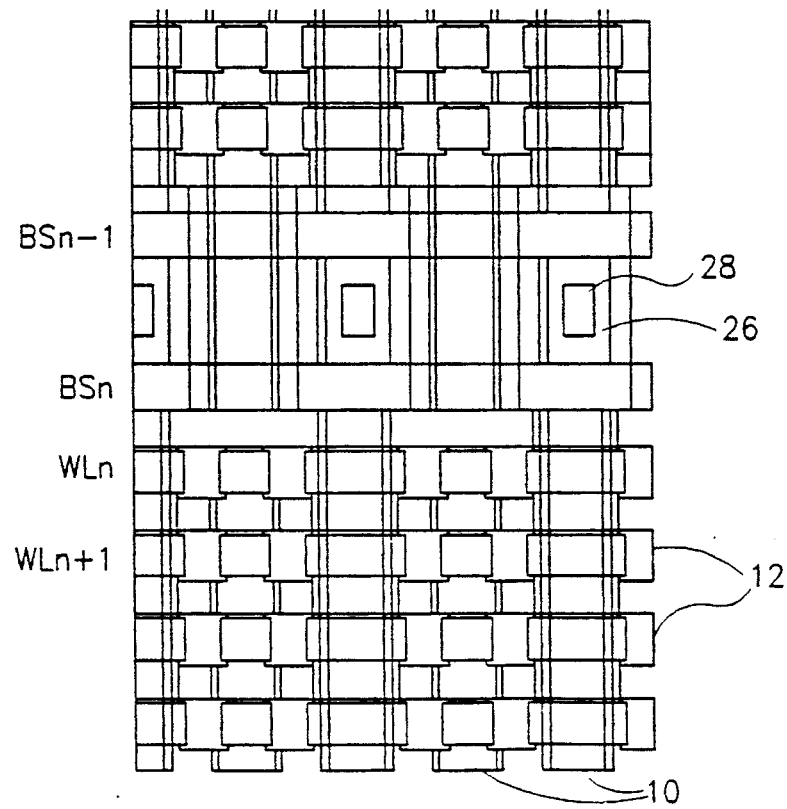
Figure 2:
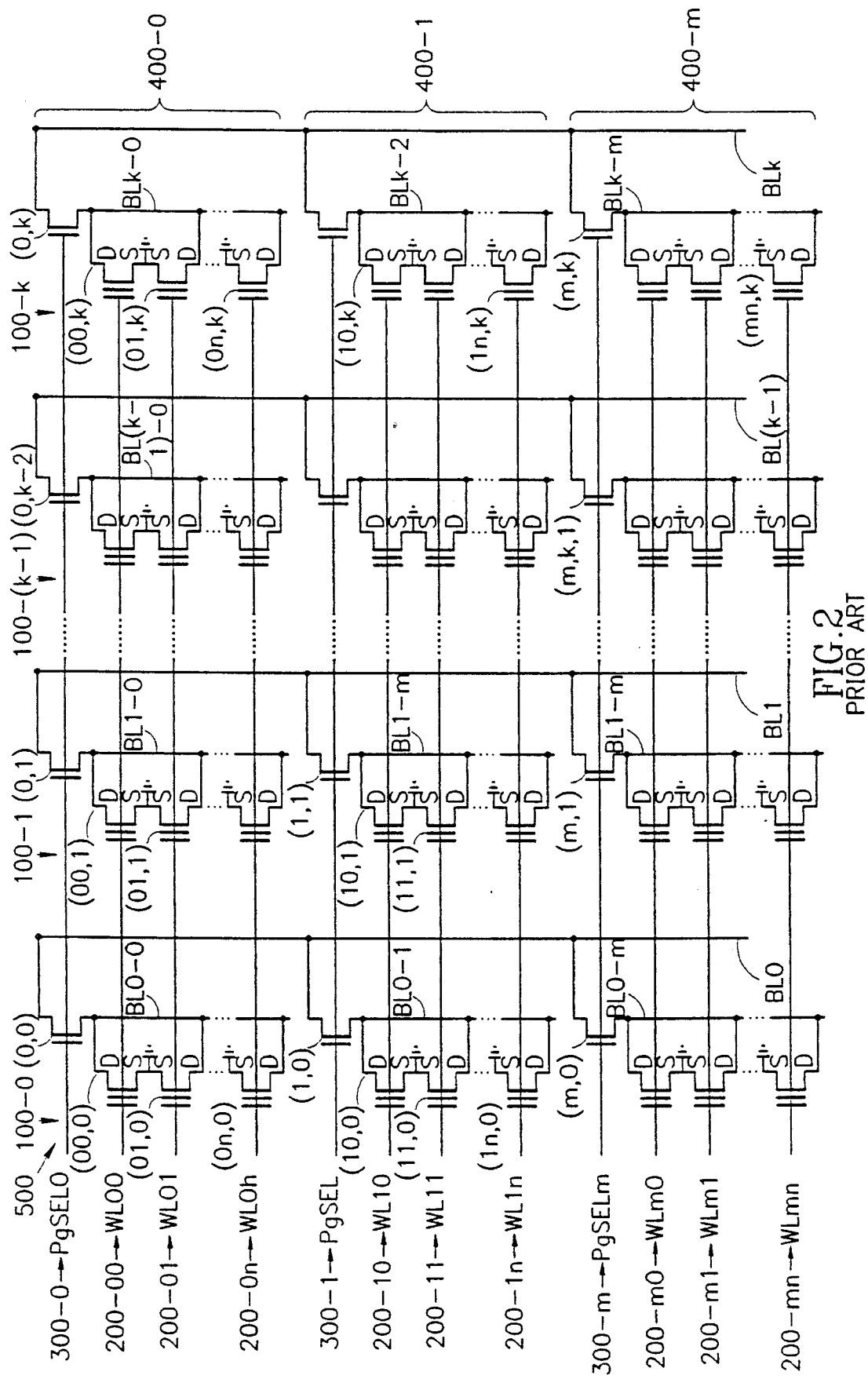
FIG. 2 is a circuit diagram illustration of a prior art segmented EEPROM architecture.
Figure 3:
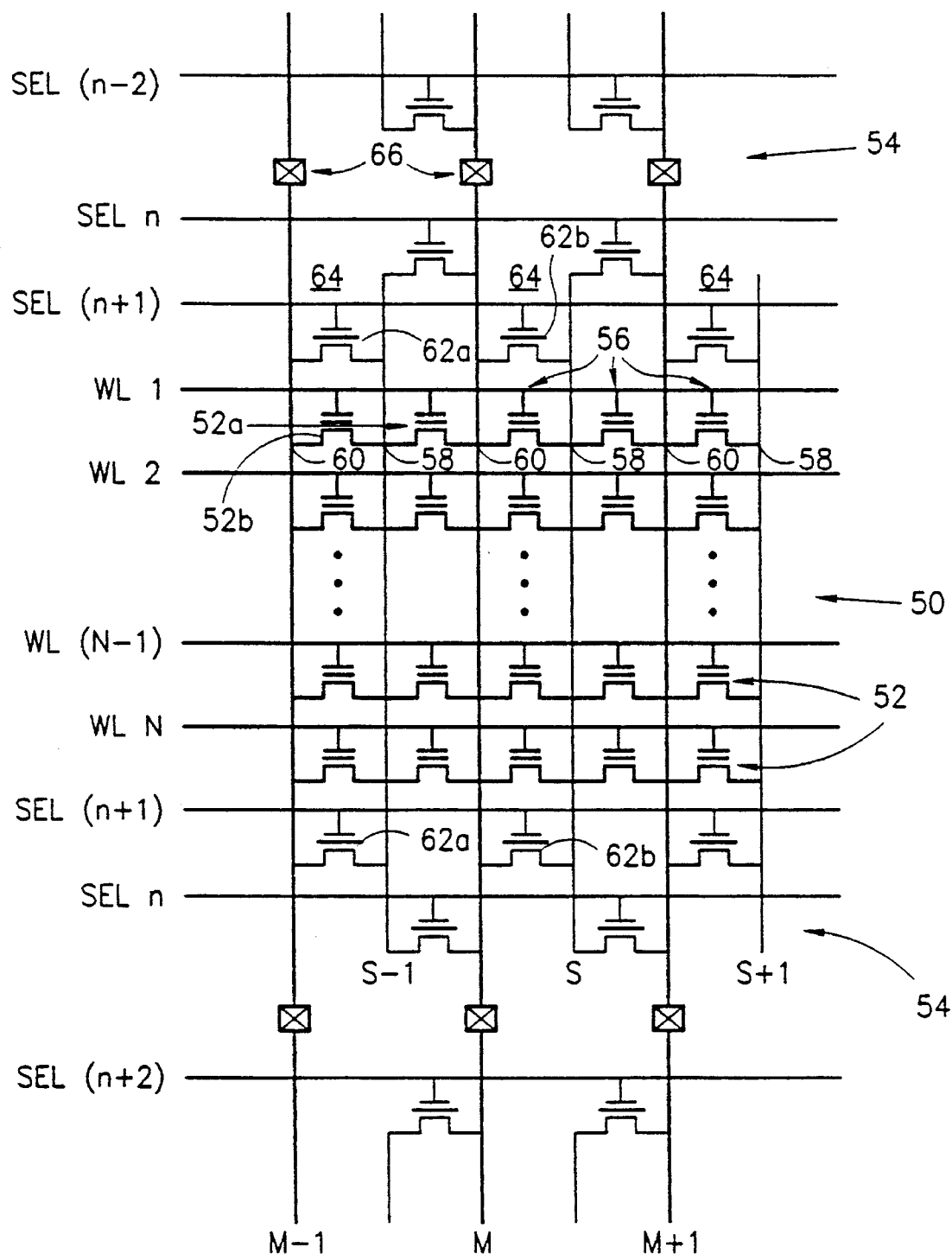
FIG. 3 is a circuit diagram illustration of a prior art alternating metal ground EPROM architecture.
Figure 4:
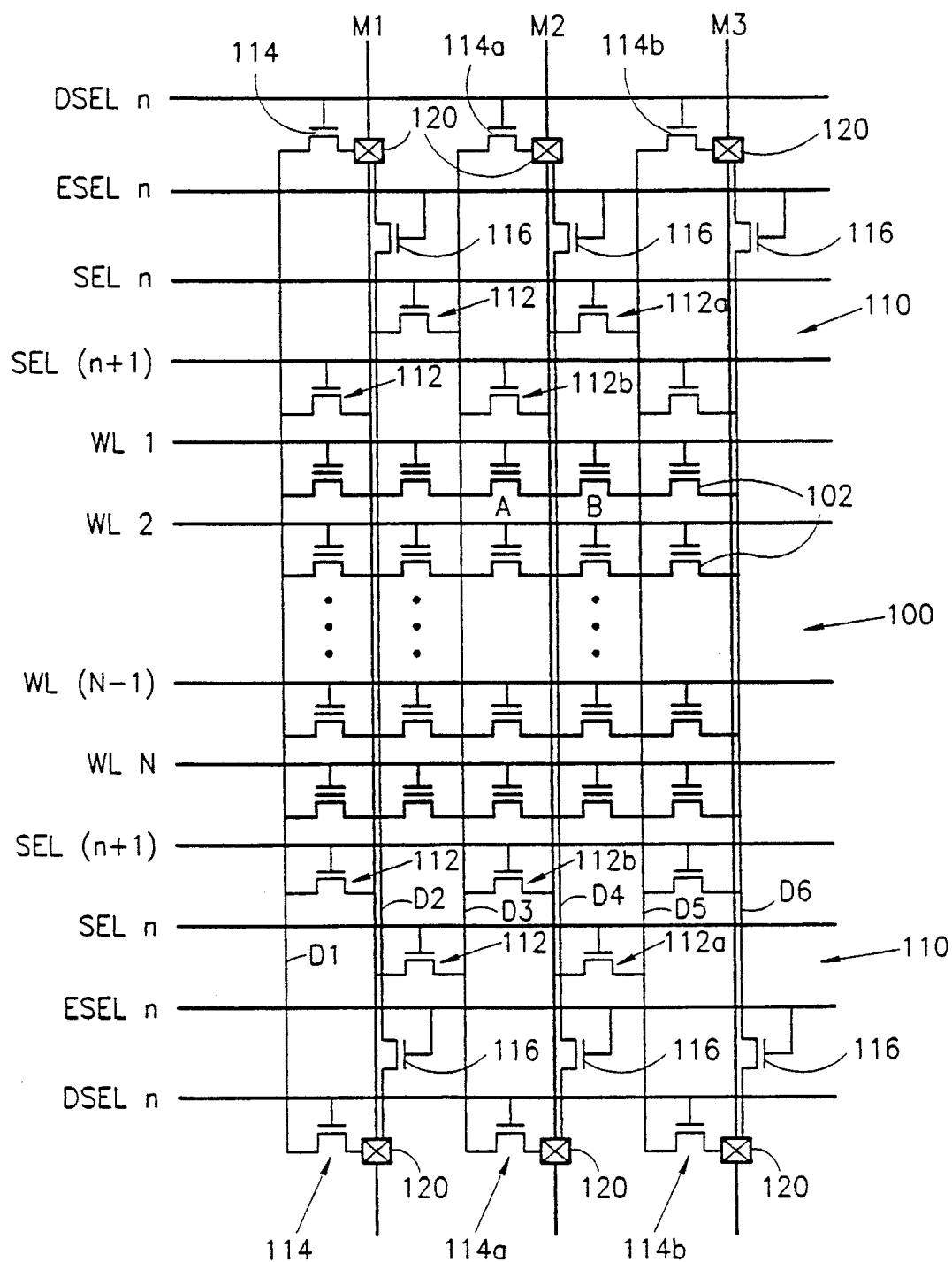
FIG. 4 is a schematic circuit diagram illustration of a flash EEPROM array having an alternating metal ground architecture, constructed and operative in accordance with a preferred embodiment of the present invention.

Both the EEPROM areas 100 and the control areas 110 have diffusion bit lines $D_i$ extending through them, where there is one diffusion bit line on each side of each EEPROM cell 102. In FIG. 4, six diffusion bit lines $D_1$–$D_6$ are shown, where the even and odd ones will herein be referenced by $D_e$ and $D_o$, respectively. It will be noted that the even and odd diffusion bit lines $D_e$ and $D_o$, respectively, form the source and drain lines for the EEPROM cells 102.

In the present invention, all the diffusion bit lines are segmented and none are metal-strapped. Continuous metal lines $M_i$ exist and are laid down next to every even diffusion bit line $D_e$. Each metal line $M_i$ has contacts 120 connected thereto within each control area 110.

Each control area 110 typically comprises rows of even and odd column select transistors 112, bit line select transistors 114, and erase select transistors 116. Column select transistors 112 lie between every two diffusion bit lines, bit line select transistors 114 extend from an odd diffusion bit line $D_o$ to its neighboring even diffusion bit line $D_e$ and erase select transistors 116 lie across even diffusion bit lines $D_c$.

Bit line select transistors 114 are activated by appropriate voltages on two bit line select lines DSELn, the even column select transistors 112 are activated by voltages on the two select lines SELn and the odd column select transistors 112 are activated by voltages on the two select lines SEL(n+1). The erase select transistors 116 are activated by voltages on two ESELn lines. The activation typically only occurs during the erase cycle.

The continuous metal lines $M_i$ can be connected to their neighboring diffusion bit lines $D_i$ through the bit line and erase select transistors 114 and 116, respectively, wherein the bit line select transistors 114 connect to the odd diffusion bit lines $D_o$ and the erase select transistors 116 connect to the even diffusion bit lines $D_e$.

In accordance with a preferred embodiment of the present invention, the column select transistors 112 connect between the even and odd diffusion bit lines and do not connect to the metal lines $M_i$. Column select transistors 112 thus connect the source lines $D_e$ of each EEPROM cell 102 to a neighboring diffusion line $D_o$, which, in turn, is connected to the appropriate metal line $M_i$ via the appropriate bit line select transistor 114. This is described hereinbelow with respect to the two EEPROM cells labeled A and B (FIG. 4).

In order to read or program EEPROM cell A, the following lines are activated: bit line select lines DSELn, word line WL1 and select lines SELn. Metal line $M_2$ receives the drain voltage and $M_3$ receives the source voltage. The erase select transistors 116 are not activated during reading and programming. The resultant operation of the array is as follows:

The word line WL1 activates the first row of the EEPROM area 100.

Bit line select lines DSELn activate the bit line select transistors 114, thereby selecting the particular EEPROM area 100. Of interest, bit line select transistors 114a connect metal line $M_2$, on which there is a positive voltage of 2 V for reading and 6–8 V for programming, to the drain line $D_3$ of EEPROM cell A. Bit line select transistors 114b connect rectal line $M_3$ on which there is 0 V to the diffusion bit line $D_5$ which, in turn, is connected through column select transistors 112a to the source line $D_4$ of EEPROM cell A.

Column select transistors 112a are activated, by the voltage on select lines SELn.

A similar operation occurs for accessing EEPROM cell B, as follows: bit line select lines DSELn, word line WLI and select lines SEL(n+1) are activated, metal line $M_3$ receives the drain voltage and $M_2$ receives the source voltage. The resultant operation of the integrated circuit is as follows:

The word line WL1 activates the first row of the EEPROM area 100.

Bit line select lines DSELn activate the bit line select transistors 114, thereby selecting the particular EEPROM area 100. Bit line select transistors 114a and 114b connect metal lines $M_2$ and $M_3$ as before. However, for accessing EEPROM cell B, $M_2$ has 0 V and is connected to source line $D_4$ Of EEPROM cell B via column select transistors 112b, which, in turn, are activated by select lines SEL(n+1). Bit line select transistors 114b connect metal line $M_3$, which has either the reading voltage of 2 V or the programming voltage of 6–8 V, to the diffusion bit line $D_5$.

Because all of the diffusion bit lines $D_i$ are segmented, their capacitances are less during reading than those of the prior art architectures. The reading speed of the EEPROM array of the present invention is thus increased over that of the prior art.

During erasure, an entire EEPROM area 100 is erased at one time. In accordance with the present invention, prior to erasure, the bit line select transistors 114 are deactivated and the erase select transistors 116 of the selected block are activated. An erasure voltage of 4–5 V is provided on each of the metal lines $M_i$ which, in turn, is provided to the source side (source lines $D_e$) of the EEPROM cells 102 through the erase select transistors 116. At the same time, a negative voltage of −10—15 V is provided to all of the word lines WLj in the EEPROM area 100 to force the gate voltage of the EEPROM cells 102 to a negative value.

Table 1 summarizes the voltages needed for reading and programming EEPROM cells A and B and for erasing the entire block. Vcc is the power supply voltage for reading and VcVp is the power supply voltage for programming.

TABLE 1

Read, Program and Erase Voltages For Flash EEPROM array

| Operation | ESEL n | DSEL n | SEL n | SEL n + 1 | $M_2$ | $M_3$ | Other Metal Lines | WL 1 | WL 2 ... N |
|---|---|---|---|---|---|---|---|---|---|
| Read cell A | 0 | Vcc | Vcc | 0 | 2V | 0 | 0 | Vcc | 0 |
| Program Cell A | 0 | VcVp | Vcc | 0 | 6–8V | 0 | 0 | Vcc–VcVp | 0 |
| Read Cell B | 0 | Vcc | 0 | Vcc | 0 | 2V | 0 | Vcc | 0 |
| Program Cell B | 0 | VcVp | 0 | Vcc | 0 | 6–8V | 0 | Vcc–VcVp | 0 |
| Erase Block | Vcc | 0 | 0 | 0 | 4–5V | 4–5V | 4–5V | VWLe (Neg) | VWLe (Neg) |

The process of producing the EEPROM array of the present invention is similar to that of the prior art with the additional process steps, described hereinbelow with respect to FIG. 5 and FIGS. 6A–6E, to which reference is now made, for producing the select transistors 112–116. FIGS. 6A–6D illustrate the process on a cross-sections of a row of the control area 110. FIG. 6E illustrates a final cross-section for the erase select transistors 116.

It is a feature of the present invention that the structure of the control area 110 maintains the poly pitch of the EEPROM area 100. As will be described hereinbelow, this is achieved by locating each column, bit and erase select transistor 112, 114 and 116, respectively, between two diffusion bit lines $D_i$ and by ensuring that the sizes of the transistors 112–116 do not exceed the poly pitch of EEPROM area 100.

Figure 5:
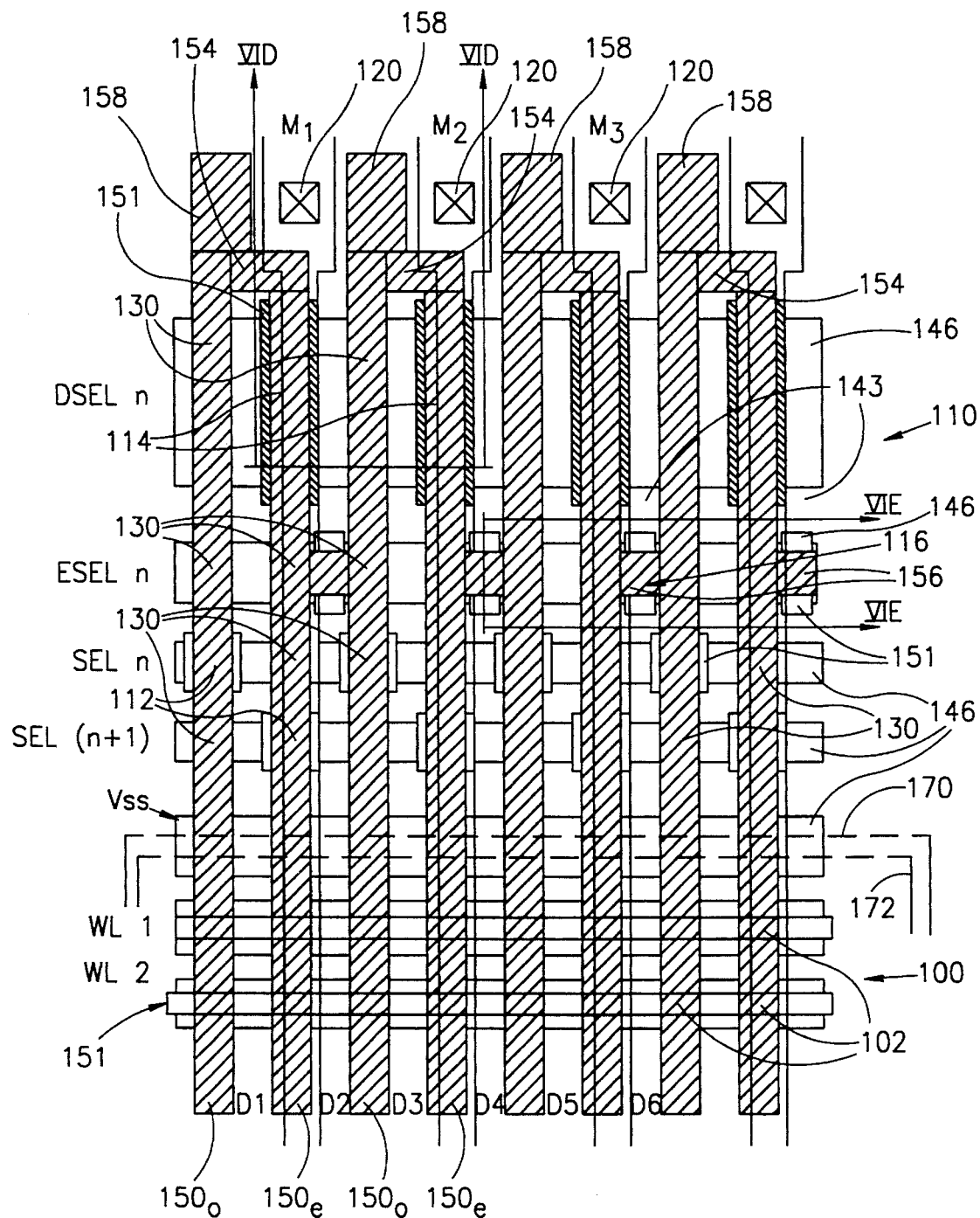
FIG. 5 is a manufacturing layout of the flash EEPROM array of FIG. 4.

In FIG. 5, the layers of the layout have been drawn to show their location and relative size rather than the order with which they are laid down. Thus, the poly 1 layer, shown with slashes, is shown over the poly 2 layer, shown as a wide white line. Furthermore, the control lines S ELj, DS ELj, ES ELj and WLi are also indicated.

The first layer to be deposited is an oxide layer deposited in rows wherever poly 2 is to be laid down. It has thick portions and thin portions, where, for clarity only, FIG. 5 illustrates the thin portions, labeled 151, only. The oxide layer in the EEPROM area 100 includes is a tunnel oxide typically of 100 Å.

In the control area, the thin portions are laid down wherever the select transistors 112–116 are to be located. In the portions of the control area 110 where isolation is desired, the oxide is either a standard field oxide or a relatively thick oxide layer as per the U.S. Patent Application entitled "SCALABLE EPROM ARRAY" to Reza Kazerounian, Rustom F. Irani and Boaz Eitan, to be filed the same day herewith and assigned to the common assignees of the present invention. The above-mentioned U.S. Patent Application is incorporated herein by reference. The thick oxide elements form part of isolation units 130 which isolate the neighboring select transistors 112–116 from each other.

The poly 1 layer is laid down next. It is typically formed of a plurality of thin vertical straight lines 150 extending between the control and EEPROM areas 110 and 100, respectively. The lines 150 are divided into even lines 150$e$ and odd lines 150$o$. The poly 1 layer also includes a plurality of isolating cross-lines 154 and. 156 (FIG. 5) and isolating units 158 in the control area 110. Between lines 150 are the diffusion bit lines $D_i$.

Isolating cross-lines 154 are located above bit line select transistors 114 and extend from odd lines 150$o$ to even lines 150$e$ across the odd diffusion bit lines $D_o$. Isolating cross-lines 156 are located above select transistors 114 and extend from even lines 150$e$ to odd lines 150$o$ across the even diffusion bit lines $D_e$. Isolating units 158 are formed above isolating cross-lines 154 between contacts 120.

Figure 6A:
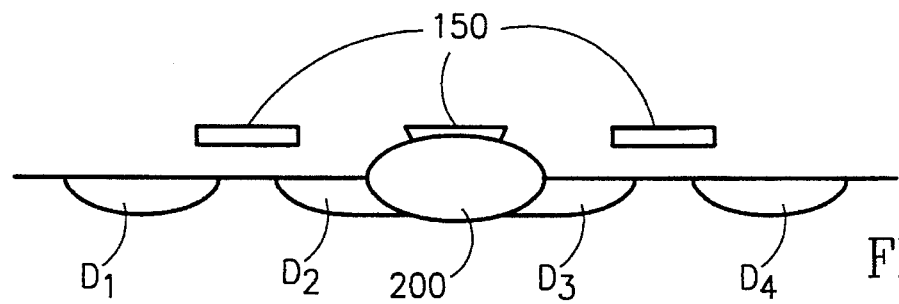
FIGS. 6A, 6B, 6C and 6D are cross-sectional illustrations of a control area of the flash EEPROM array of FIG. 4 showing the fabrication process, where

The poly 1 layer has two functions: 1) it forms part of the EEPROM cells 102; and 2) it acts as a mask for the implantation of the diffusion bit lines $D_i$. FIG. 6A illustrates a cross-section of the control area 110 after deposition of the oxide layer (the thick oxide, labeled 200, is shown), the poly 1 layer, labeled 150, and implantation of the diffusion bit lines $D_i$.

In the control areas 110, the poly 1 layer is removed one the bit lines $D_i$ have been defined. Thus, the isolating cross-lines 154 and 156 act to segment the corresponding diffusion bit lines $D_o$ and $D_e$, respectively. Isolating units 158 are operative to isolate the metal lines $M_i$ from each other.

Figure 6B:
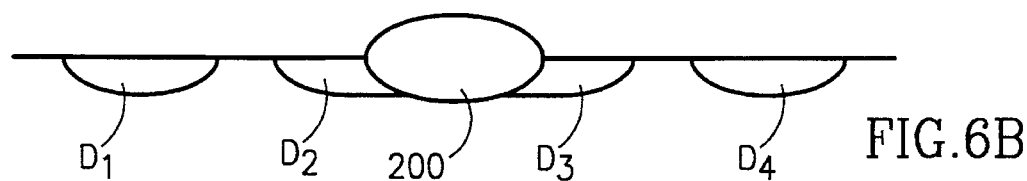
Figure 6C:
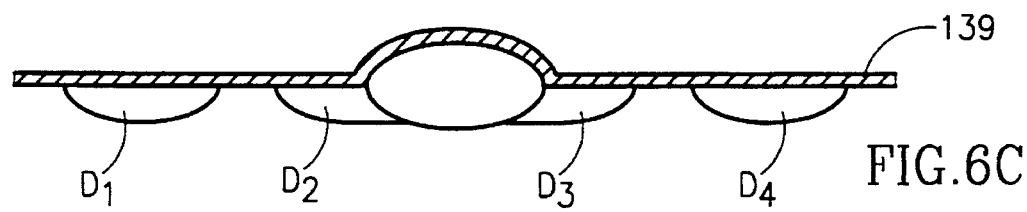

Prior to removing the poly 1 layer, an array cover mask 170 (FIG. 5) is laid over the EEPROM areas 100 to protect the poly 1 lines in them. The poly 1 layer is then removed, in accordance with the present invention, from the control areas 110 and, in accordance with standard practice, from the CMOS periphery. FIG. 6B illustrates a cross-section of a portion of the control area 110 after removal of the poly 1 layer.

After removing the poly 1 layer from the control area 110, another oxide layer 139 (FIG. 6C) is grown to produce side oxides of the poly 1 layers of the EEPROM cells 102. The side oxide is typically 100–300 Å thick. In the control areas 110 where the poly 1 layer has been removed, the oxide layer 139 grows in the region of the thin oxide layer previously laid down.

The poly 2 layer 146 is then laid down, in horizontal lines throughout the array. In the EEPROM areas 100 the poly 2 layer 146 is laid on top of and perpendicular to the poly lines and for,s the word lines WLi. During a self-aligned etch step, the poly 2 layer of the EEPROM areas 100 is utilized as a mask to remove those parts of the poly 1 layer which do not lie underneath the poly 2 layer. Thus, the EEPROM cells 102 are produced at the intersection of the poly 2 lines and the poly 1 lines. Before the etch step, a self-aligned etch mask 172 (FIG. 5) is placed over the control area 110, to be removed after the etch is finished.

Figure 6D:
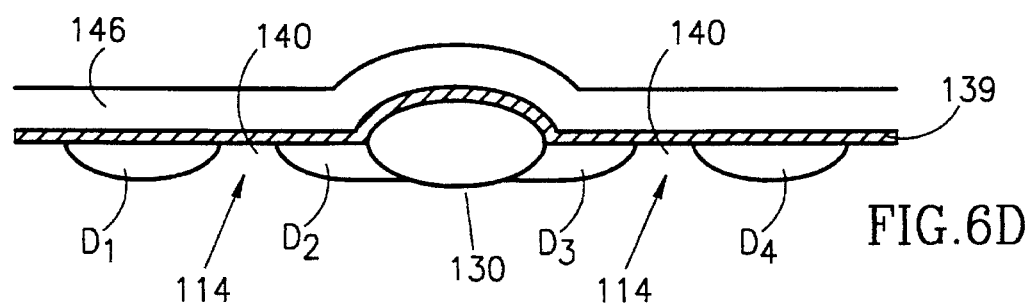
Figure 6E:
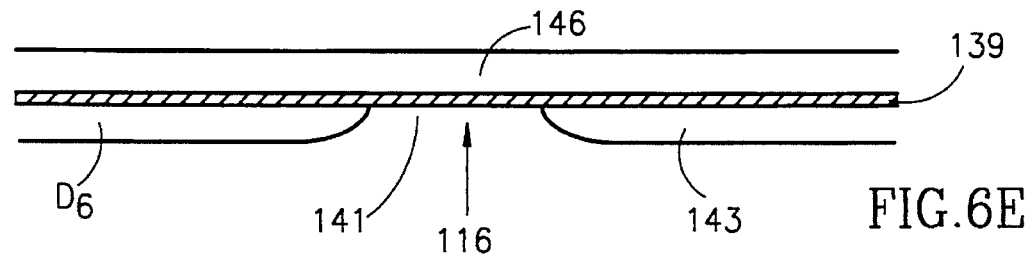
FIG. 6E is a cross-sectional illustration taken along lines VIE—VIE of FIG. 5 illustrating an erase select transistor.

In the control areas 110 wherein the poly 1 layer is removed, the poly 2 layer 146 lies over the diffusion lines and the oxides. This is shown in FIG. 6D. The poly 2 layer in the control areas 110 forms the select lines DSELj, ESELj and SELj. At the intersection of the removed poly 1 lines and the poly 2 layer, where there are no thick or field oxides, lie the select transistors 112–116.

The thick or field oxides ("isolating oxides") are located to ensure that there is no leakage between bit lines due to the select transistors 112–116. Thus, in the row of bit line select transistors 114, there are isolating oxides under every odd poly 1 line 150$o$. In the row of erase select transistors 116, there are isolating oxides under every poly 1 line 150$o$ and 150$e$, next to the cross-lines 156. In the rows of the column select transistors 112, the isolating oxides are under every line 150 but in alternating rows, as shown.

It is noted that the lines of poly 2 layer 146 which produce the bit line select transistors 114 are considerably wider than those which produce column and erase select transistors 112 and 116, respectively.

Finally, the metal lines $M_i$ and contacts 120 are laid down in the locations illustrated in FIG. 5. The metal lines $M_i$ are deposited on top of, but insulated from, every other poly 1 line. This contrasts with the prior art alternating metal virtual ground architecture in which the metal lines are laid directly on top of diffusion bit lines.

It is noted that, since the gates of the select transistors 112–116 are formed from only the poly 2 layer, select transistors 112–116 are n-channel transistors. However, the diffusions of the select transistors 112–116 are aligned to the removed poly 1 layer rather than to the poly 2 layer as in the prior art. The select transistors 112–116 are thus aligned with the diffusion bit lines $D_i$ of the EEPROM areas 100, thereby maintaining the poly pitch throughout the EEPROM array.

Column and bit line select transistors 112 and 114 are formed at the intersection of the vertical straight lines 150 (FIG. 5) of poly 1 and the SELi and DSELi poly 2 lines while erase select transistors 116 are formed wherever the ESELn poly 2 lines line over the horizontal isolating cross-lines 156.

FIGS. 6D and 6E, taken along lines VID—VID and VIE—VIE of FIG. 5, respectively illustrate the final cross-sections of select transistors 114 and 116.

The bit line select transistors 114 typically comprise channels 140 between diffusion bit lines $D_e$ and $D_o$. Between neighboring channels 140 are isolation units 130 formed of thick or field oxides. The layer 146 of poly 2 is deposited over channels 140, isolation units 130 and diffusion bit lines $D_e$ and $D_o$.

The erase select transistors 116 are formed of a channel 141 between even diffusion lines $D_e$ and a bit fine 143 having a metal contact $M_i$. Because the erase select transistors 116 utilize the horizontal isolating cross-lines 156, they maintain the poly pitch of the array while not significantly increasing the size of the EEPROM array. Furthermore, because they are n-channel transistors, they can successfully pass the erase voltage.

In order to successfully pass the high voltages (6–8 V) which are provided to the diffusion bit lines $D_o$ during programming, the n-channel bit line select transistors 114 must be wide. Column select transistors 112, on the other hand, pass only the voltages of sources and therefore, are much narrower. Erase select transistors 116 pass the erase voltage of 4–5 V. Since the erase current is very low, on the order of nanoamperes, the erase select transistors 116 can be very small.

layer is 200 Å thick. It is noted that there is no thick oxide layer in the EPROM areas 180; the oxide layer is only a thin oxide layer. The process for creating the select transistors is the same as described hereinabove.

Figure 7:
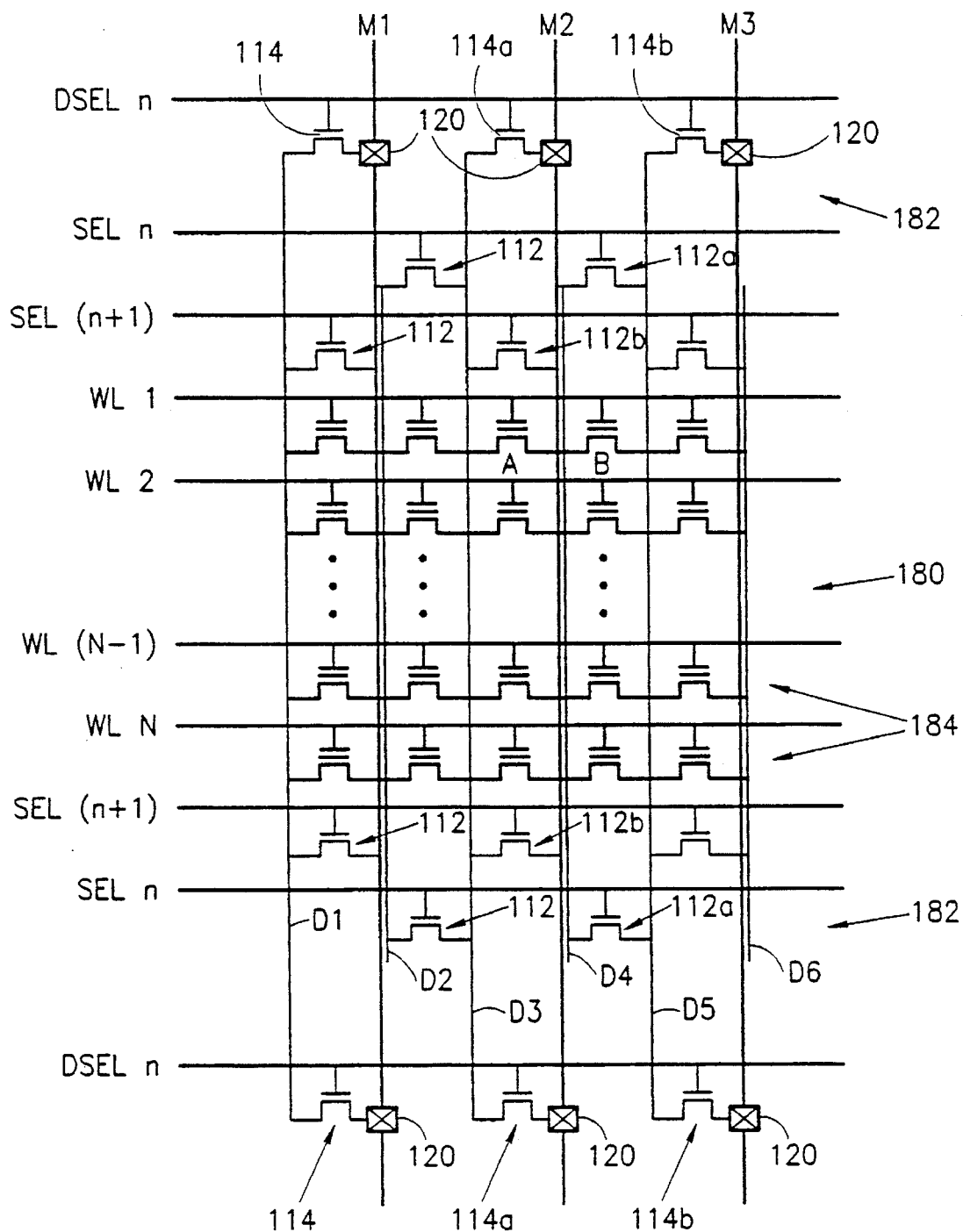
FIG. 7 is a schematic circuit diagram illustration of an EPROM array having an alternating metal ground architecture, constructed and operative in accordance with a second preferred embodiment of the present invention.
Figure 8:
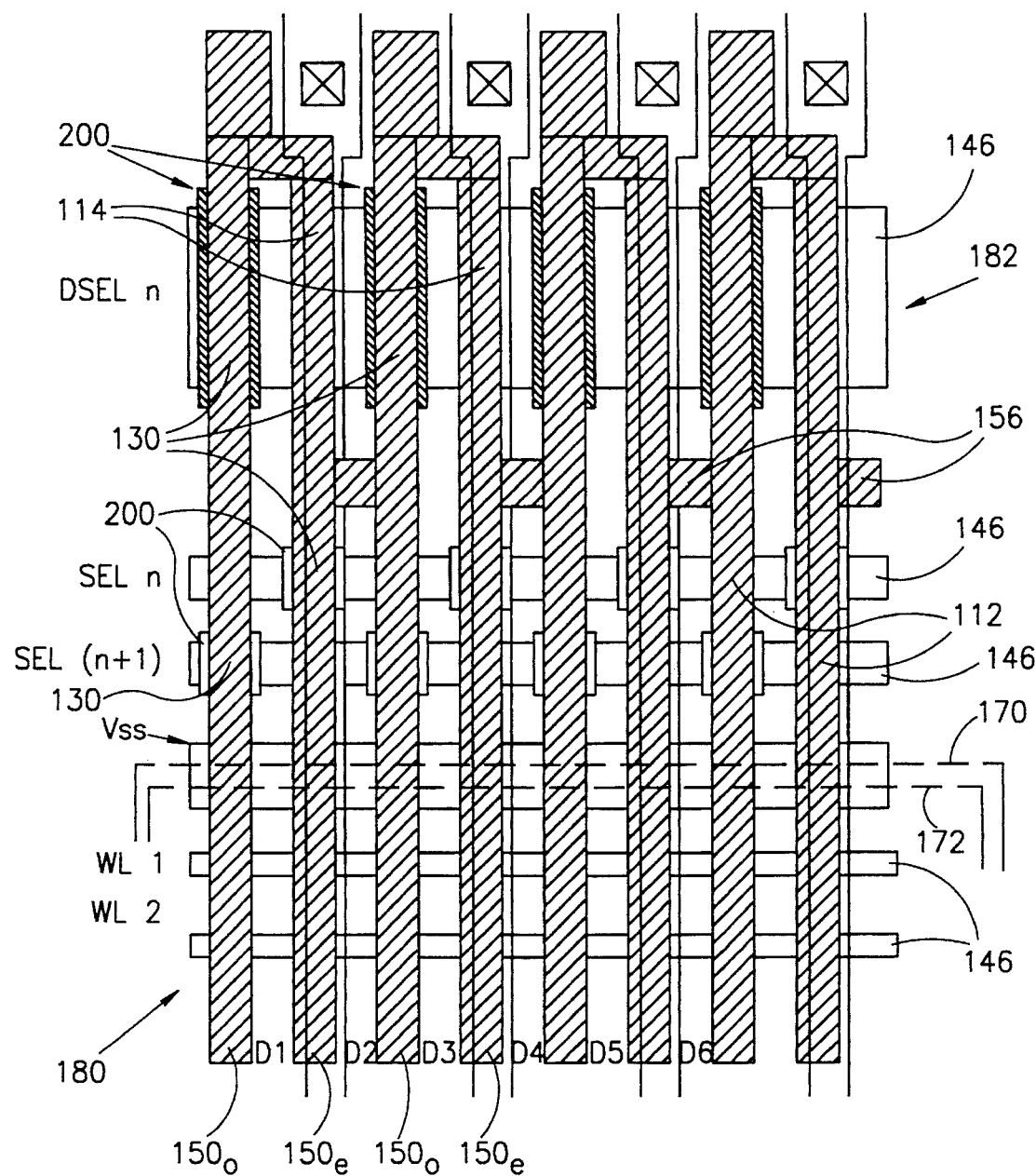
FIG. 8 is a manufacturing layout of the EPROM array of FIG. 7.

The array layout of FIGS. 7–8 can also be utilized as an EEPROM array which has a drain erase capability. In this embodiment, there is an EEPROM area rather than an EPROM area. When it is desired to erase the data stored in a given block, the bit line select lines DSELn and all of the wordlines WLi are activated and voltage is provided on all of the metal lines $M_i$.

The voltages for reading and programming the cells labeled A and B and for erasing an entire block are presented in Table 2 hereinbelow.

TABLE 2

| | Read, Program and Erase Voltages of the drain erase EEPROM array | | | | | | | |
|---|---|---|---|---|---|---|---|---|
| Operation | DSEL n | SEL n | SEL n + 1 | $M_2$ | $M_3$ | Other Metal lines | WL 1 | WL 2 ... N |
| Read cell A | Vcc | Vcc | 0 | 2V | 0 | 0 | Vcc | 0 |
| Program Cell A | VcVp | Vcc | 0 | 6–8V | 0 | 0 | Vcc–VcVp | 0 |
| Read Cell B | Vcc | 0 | Vcc | 0 | 2V | 0 | Vcc | 0 |
| Program Cell B | VcVp | 0 | Vcc | 0 | 6–8V | 0 | Vcc–VcVp | 0 |
| Erase Block | VcVp | 0 | 0 | 4–5V | 4–5V | 4–5V | VcVe (Neg) | VcVe (Neg) |

As can be seen, the present invention is a flash EEPROM array whose control area maintains the poly pitch of the its EEPROM area. The concepts of the flash EEPROM array can also be utilized for electrically programmable read only memory (EPROM) arrays and for non-flash EEPROM arrays, as described hereinbelow with respect to FIGS. 7 and 8.

FIG. 7 is the circuit diagram and FIG. 8 is the layout for the EPROM array of the present invention. As can be seen, the array is similar to that of the flash EEPROM array of FIGS. 4 and 5 with three exceptions: 1) it is comprised of an EPROM area 180 and a control area 182; 2) in the EPROM area 180, the cells, labeled 184, are EPROM cells and 3) in the control area 182, there are no erase select transistors 116 and thus, no erase select lines ESELn.

It is noted that, for clarity purposes, the portions of the oxide layer shown in FIG. 8 are the thick oxide elements 200. The thin oxide elements 151 exist between the thick oxide elements 200 of any row in the control area. The remaining elements are the same and thus, are referenced with the same reference numerals. The operation of the EPROM array is also the same as that of the EEPROM array.

It is noted that the layout of FIG. 8 is very similar to that of FIG. 5. In fact, the only difference is that the poly 2 layer over the isolation cross-lines 156 does not exist in the EPROM embodiment of FIG. 8. Thus, the isolation cross-lines 156 still exist but they only provide segmentation of the even diffusion lines $D_e$.

It will be appreciated that the EPROM array of FIGS. 7 and 8 is a fully segmented EPROM array whose control areas maintain the poly pitch of the EPROM areas.

It will further be appreciated that the manufacturing process for the EPROM array shown in FIGS. 7 and 8 is as described hereinabove, with the exception that the thin oxide It will be appreciated by persons skilled in the art that the present invention is not limited to what has been particularly shown and described hereinabove. Rather the scope of the present invention is defined only by the claims which follow:

We claim:

1. A flash electrically erasable programmable read only memory (EEPROM) array comprising:

EEPROM areas including columns of EEPROM transistors, each EEPROM transistor having a channel of a first length;

at least one control area per EEPROM area, said at least one control area including columns of n-channel select transistors, formed into bit line and column select transistors, each n-channel bit line transistor and column select transistor having a channel length of a second length;

wherein said first and said second lengths are substantially the same.

2. A flash EEPROM array according to claim 1 wherein each of said columns of EEPROM transistors in one EEPROM area is directly in line with a corresponding one of said columns of select transistors in the corresponding at least one control area per EEPROM area and also including segmented diffusion bit lines aligned to said columns of said EEPROM and select transistors, said diffusion bit lines being formed into even and odd diffusion bit lines.

3. A flash EEPROM array according to claim 2 wherein segmented diffusion bit lines of one control area are directly in line with, but not connected to, segmented diffusion bit lines of a neighboring control area and wherein said array also includes erase transistors connecting neighboring, aligned, odd diffusion bit lines.

4. A flash EEPROM array according to claim 3 and also including metal lines, each one lying near one of said even diffusion bit lines, wherein said column select transistors connect between said even and odd diffusion bit lines, said bit line select transistors connect between said metal lines and said odd diffusion bit lines, and said erase select transistors connect between said metal lines and said even diffusion bit lines.

5. A flash EEPROM array according to claim 4 and wherein drain erase is achieved by activating said bit line select transistors and by providing voltage on said metal lines.

6. A flash EEPROM array according to claim 1 and wherein said EEPROM areas are formed as alternating metal, virtual ground EEPROM areas.

7. An electrically programmable read only memory (EPROM) array comprising:

EPROM areas including columns of EPROM transistors, each EPROM transistor having a channel of a first length;

at least one control area per EPROM area, each at least one control area including columns of n-channel select transistors, formed into bit line and column select transistors, each n-channel bit line transistor and column select transistor having a channel of a second length;

wherein said first and said second lengths are substantially the same.

8. An EPROM array according to claim 7 wherein each of said columns of EPROM transistors in one EPROM area is directly in line with a corresponding one of said columns of select transistors in the corresponding at least one control area per EPROM area and also including segmented diffusion bit lines aligned to said columns of said EPROM and select transistors, said diffusion bit lines being formed into even and odd diffusion bit lines.

9. An EPROM array according to claim 8 wherein segmented diffusion bit lines of one control area are directly in line with, but not connected to, segmented diffusion bit lines of a neighboring control area.

10. An EPROM array according to claim 9 and also including metal lines, each one lying near one of said even diffusion bit lines, wherein said column select transistors connect between said even and odd diffusion bit lines and said bit line select transistors connect between said metal lines and said odd diffusion bit lines.

11. An EPROM array according to claim 7 and wherein said EPROM areas are formed as alternating metal, virtual ground EPROM areas.

* * * * *